(12) United States Patent
Gurtej et al.

(10) Patent No.: US 8,034,687 B2
(45) Date of Patent: *Oct. 11, 2011

(54) METHODS OF FORMING A PLURALITY OF TRANSISTOR GATES, AND METHODS OF FORMING A PLURALITY OF TRANSISTOR GATES HAVING AT LEAST TWO DIFFERENT WORK FUNCTIONS

(75) Inventors: Sandhu S. Gurtej, Boise, ID (US); Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/904,038

(22) Filed: Oct. 13, 2010

(65) Prior Publication Data
US 2011/0039404 A1 Feb. 17, 2011

Related U.S. Application Data

(63) Continuation of application No. 12/265,070, filed on Nov. 5, 2008, now Pat. No. 7,824,986.

(51) Int. Cl.
*H01L 21/8234* (2006.01)
(52) U.S. Cl. .................. 438/275; 257/E21.637
(58) Field of Classification Search .................. 438/197, 438/199, 272, 275, 573, 581, 582, 583, 591, 438/592; 257/E29.158, E29.16, E29.637
See application file for complete search history.

(56) References Cited

U.S. PATENT DOCUMENTS

| | | | |
|---|---|---|---|
| 4,714,519 A | 12/1987 | Pfiester | |
| 5,013,680 A | 5/1991 | Lowrey et al. | |
| 5,122,848 A | 6/1992 | Lee et al. | |
| 5,547,890 A | 8/1996 | Tseng | |
| 5,619,057 A | 4/1997 | Komatsu | |
| 5,714,412 A | 2/1998 | Liang et al. | |
| 5,909,618 A | 6/1999 | Forbes et al. | |
| 5,941,701 A | 8/1999 | Moran et al. | |
| 5,960,270 A | 9/1999 | Misra et al. | |
| 5,963,469 A | 10/1999 | Forbes | |
| 5,977,579 A | 11/1999 | Noble | |
| 6,072,209 A | 6/2000 | Noble et al. | |
| 6,130,453 A | 10/2000 | Mei et al. | |
| 6,150,687 A | 11/2000 | Noble et al. | |

(Continued)

OTHER PUBLICATIONS

WO 2009/061823, May 17, 2010, Written Opinion.

(Continued)

*Primary Examiner* — Brook Kebede
(74) *Attorney, Agent, or Firm* — Wells St. John P.S.

(57) ABSTRACT

A method of forming a plurality of transistor gates having at least two different work functions includes forming first and second transistor gates over a substrate having different widths, with the first width being narrower than the second width. A material is deposited over the substrate including over the first and second gates. Within an etch chamber, the material is etched from over both the first and second gates to expose conductive material of the first gate and to reduce thickness of the material received over the second gate yet leave the second gate covered by the material. In situ within the etch chamber after the etching, the substrate is subjected to a plasma comprising a metal at a substrate temperature of at least 300° C. to diffuse said metal into the first gate to modify work function of the first gate as compared to work function of the second gate.

33 Claims, 9 Drawing Sheets

U.S. PATENT DOCUMENTS

| | | | |
|---|---|---|---|
| 6,191,470 B1 | 2/2001 | Forbes et al. | |
| 6,225,669 B1 | 5/2001 | Long et al. | |
| 6,259,142 B1 | 7/2001 | Dawson et al. | |
| 6,300,177 B1 | 10/2001 | Sundaresan et al. | |
| 6,313,046 B1 * | 11/2001 | Juengling et al. | 438/781 |
| 6,343,114 B1 | 1/2002 | Chea, Jr. | |
| 6,373,114 B1 | 4/2002 | Jeng et al. | |
| 6,383,879 B1 | 5/2002 | Kizilyalli et al. | |
| 6,498,062 B2 | 12/2002 | Durcan et al. | |
| 6,534,837 B1 | 3/2003 | Bai et al. | |
| 6,548,870 B1 | 4/2003 | Lee | |
| 6,552,401 B1 | 4/2003 | Dennison | |
| 6,630,720 B1 | 10/2003 | Maszara et al. | |
| 6,653,698 B2 | 11/2003 | Lee et al. | |
| 6,696,746 B1 | 2/2004 | Farrar et al. | |
| 6,841,834 B2 | 1/2005 | Nowak | |
| 6,844,578 B2 | 1/2005 | Harada et al. | |
| 6,844,591 B1 | 1/2005 | Tran | |
| 6,924,190 B2 | 8/2005 | Dennison | |
| 6,956,263 B1 | 10/2005 | Mistry | |
| 7,045,406 B2 | 5/2006 | Huotari et al. | |
| 7,071,043 B2 | 7/2006 | Tang et al. | |
| 7,122,425 B2 | 10/2006 | Chance et al. | |
| 7,141,858 B2 | 11/2006 | Polishchuk et al. | |
| 7,202,535 B2 | 4/2007 | Goldbach et al. | |
| 7,214,621 B2 | 5/2007 | Nejad et al. | |
| 7,229,873 B2 | 6/2007 | Colombo et al. | |
| 7,244,659 B2 | 7/2007 | Tang et al. | |
| 7,262,089 B2 | 8/2007 | Abbott et al. | |
| 7,282,401 B2 | 10/2007 | Juengling | |
| 7,285,812 B2 | 10/2007 | Tang et al. | |
| 7,316,950 B2 | 1/2008 | Park et al. | |
| 7,332,433 B2 | 2/2008 | Choi et al. | |
| 7,349,232 B2 | 3/2008 | Wang et al. | |
| 7,384,849 B2 | 6/2008 | Parekh et al. | |
| 7,456,469 B2 | 11/2008 | Yamazaki | |
| 7,824,986 B2 * | 11/2010 | Gurtej et al. | 438/275 |
| 2002/0106858 A1 | 8/2002 | Zheng et al. | |
| 2003/0203566 A1 | 10/2003 | McQueen et al. | |
| 2004/0212024 A1 | 10/2004 | Oh et al. | |
| 2005/0139926 A1 | 6/2005 | Shimizu et al. | |
| 2005/0202632 A1 | 9/2005 | Ding | |
| 2006/0017099 A1 | 1/2006 | Paik | |
| 2006/0046354 A1 | 3/2006 | Kreipl | |
| 2006/0084247 A1 | 4/2006 | Liu | |
| 2006/0157796 A1 | 7/2006 | Kim et al. | |
| 2007/0262395 A1 | 11/2007 | Gibbons et al. | |
| 2007/0262415 A1 | 11/2007 | Smith et al. | |
| 2007/0264771 A1 | 11/2007 | Ananthan et al. | |

OTHER PUBLICATIONS

WO 2009/061823, May 17, 2010, International Search Report.

Spee et al., "Low Temperature Deposition of TiN Ceramic Material by Metal Organic and/or Plasma Enhanced CVD", TNO Institute of Applied Physics, Journal De Physique IV, vol. 5, Jun. 1995, pp. C5-719-C5-734.

Zamouche et al., "Invetigation of fast diffusing impurities in silicon by a transient ion drift method", 1995 American Institute of Physics, Jan. 30, 1995, pp. 631-633.

WO PCT/US2009/061823, May 17, 2010, International Preliminary Report on Patentability.

* cited by examiner

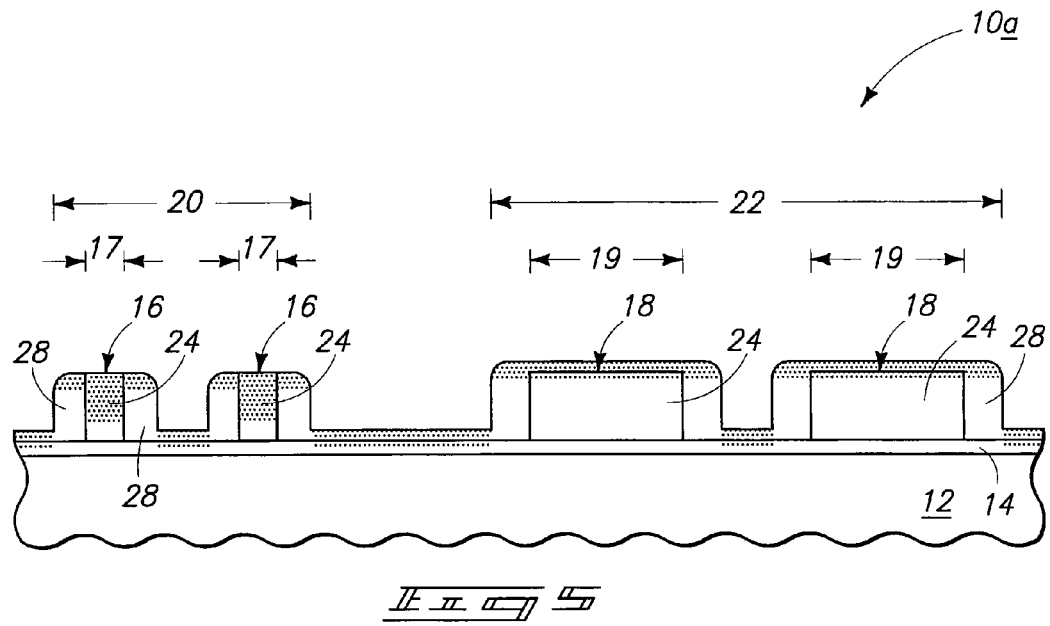
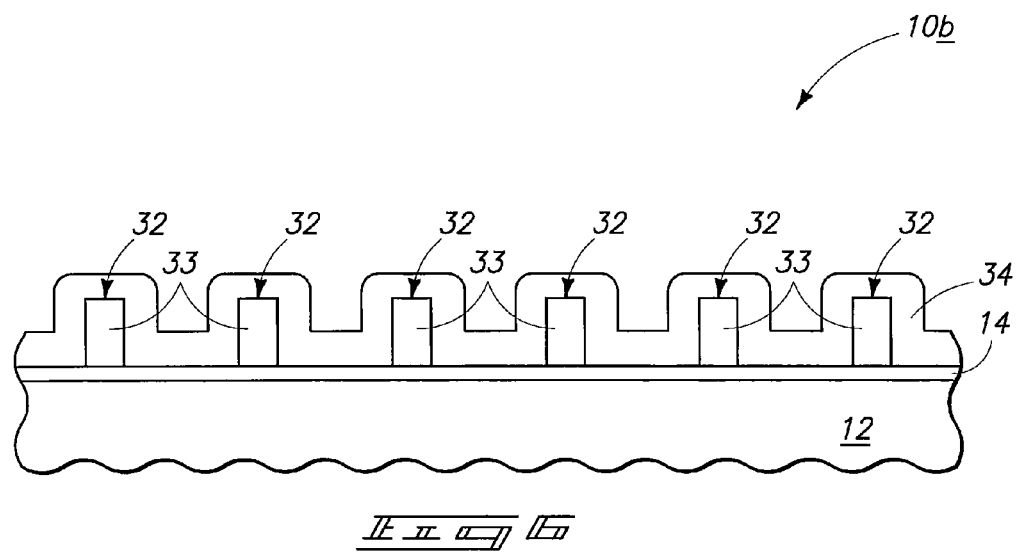

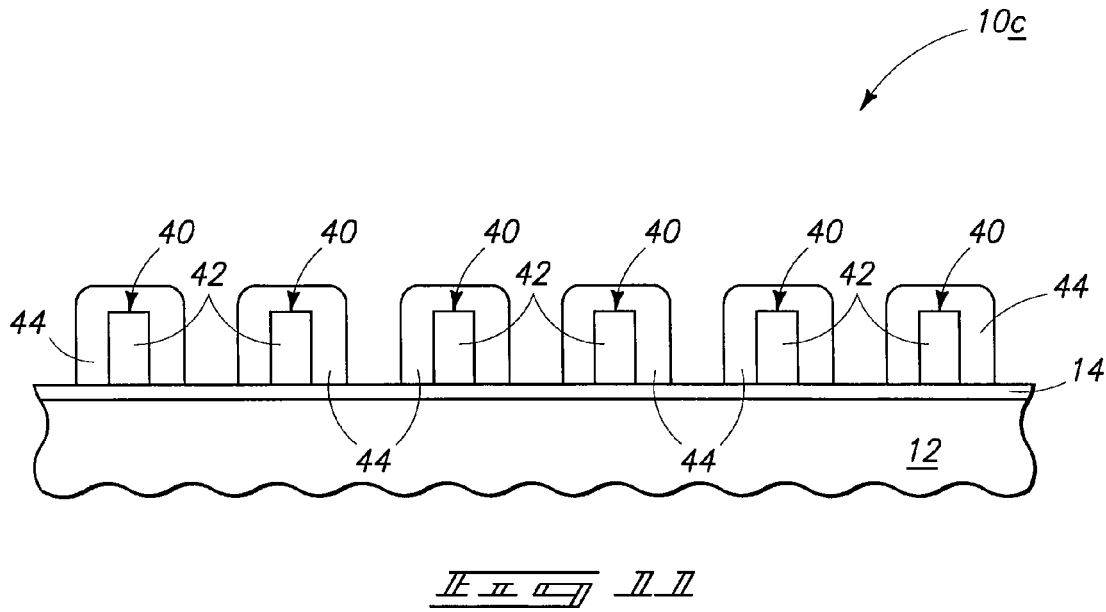
_FIG_ 11
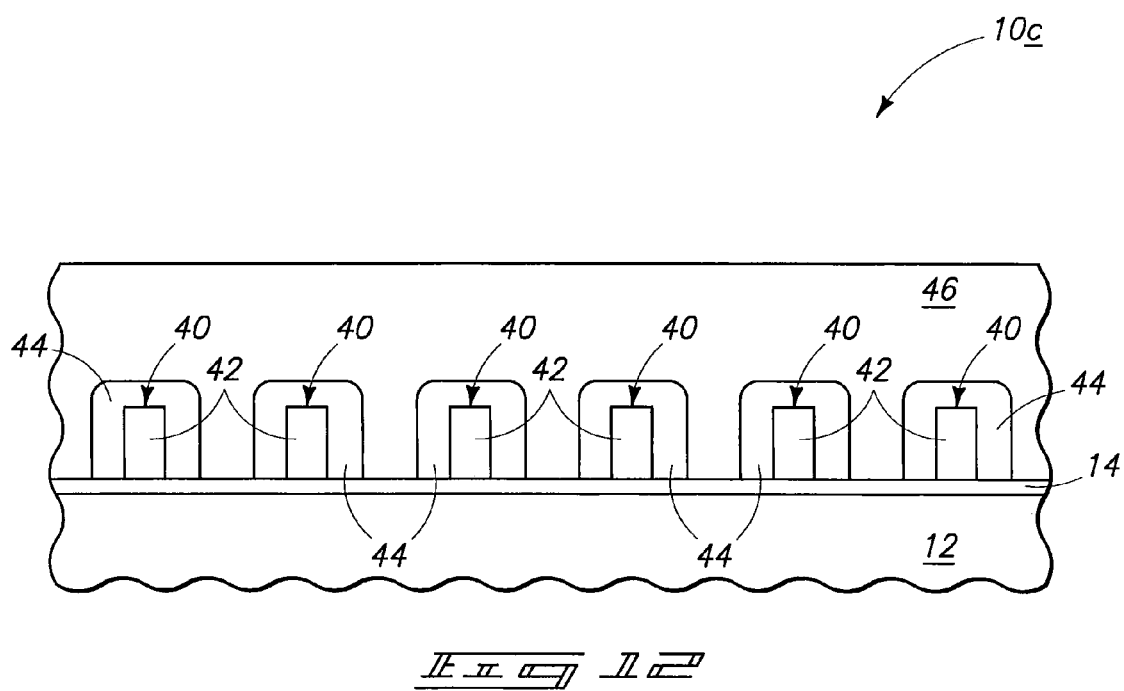
_FIG_ 12

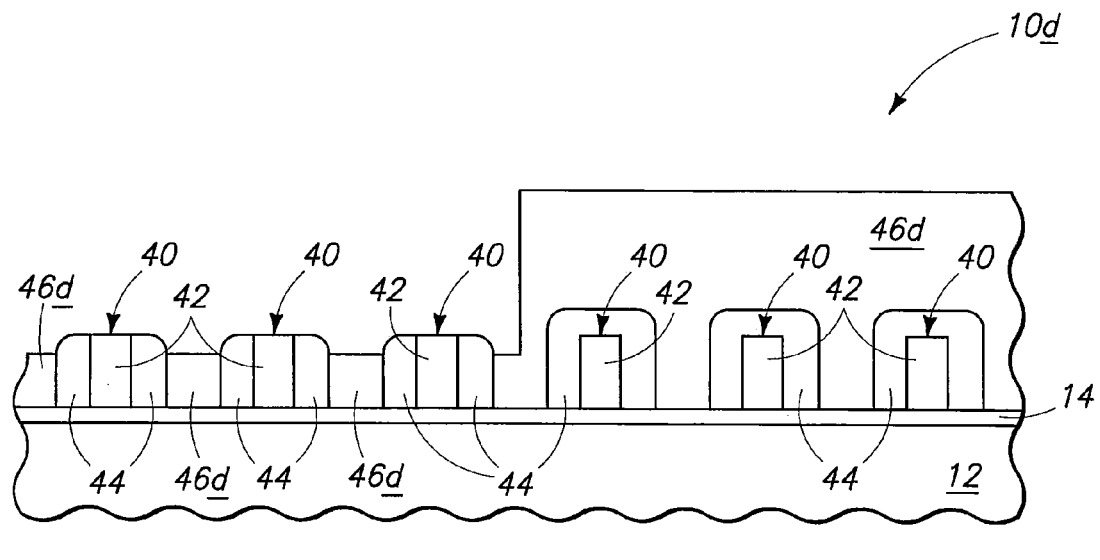
_FIG. 17_
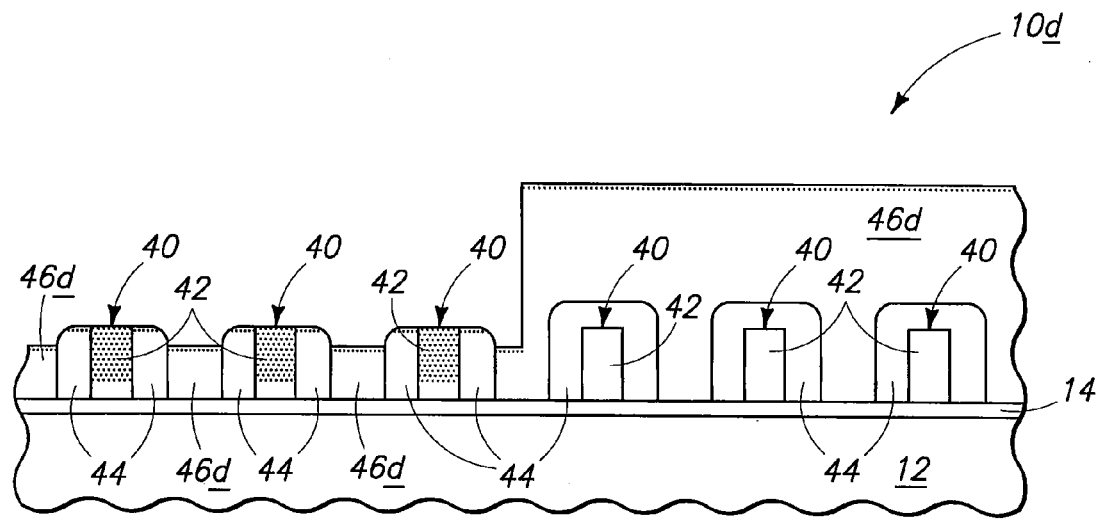
_FIG. 18_

US 8,034,687 B2

METHODS OF FORMING A PLURALITY OF TRANSISTOR GATES, AND METHODS OF FORMING A PLURALITY OF TRANSISTOR GATES HAVING AT LEAST TWO DIFFERENT WORK FUNCTIONS

RELATED PATENT DATA

This patent resulted from a continuation application of U.S. patent application Ser. No. 12/265,070, filed Nov. 5, 2008, entitled "Methods of Forming a Plurality of Transistor Gates and Methods of Forming a Plurality of Transistor Gates Having at Least Two Different Work Functions", naming Gurtej S. Sandhu and Mark Kiehlbauch as inventors, the disclosure of which is incorporated by reference.

TECHNICAL FIELD

Embodiments disclosed herein pertain to methods of forming a plurality of transistor gates which may or may not have at least two different work functions.

BACKGROUND

Field-effect transistors are one type of electronic component used in the fabrication of integrated circuitry. Such include a pair of source/drain regions have a channel region received therebetween. A gate is received proximate the channel region and separated therefrom by a gate dielectric. By applying suitable voltage to the gate of the transistor, the channel region becomes electrically conductive. Accordingly, the transistor switches from a non-conductive state to a conductive state upon application of a suitable threshold voltage to the gate. It is desirable to keep threshold voltages of transistors small and also to keep power consumption of transistors low. One significant property of the gate which is determinative of threshold voltage is work function. It is the work function of the gate, together with the doping level of the channel region, which determines the threshold voltage of a field-effect transistor device. To keep threshold voltages of transistors small and power consumption low, it is desirable that the work function of the gate material be approximately equal to the work function of the material of the channel region.

Usually, not all transistors of an integrated circuit are of the same construction or materials. Accordingly, it is recognized and often desirable that different transistor gates be fabricated to have at least two different work functions. One manner of providing different work functions is to provide different gate electrodes to be formed of different materials. For example for conductive polysilicon, using different conductivity-enhancing dopants and concentrations may provide different work functions for different transistors. For metal gates, use of different metals, or quantities of metals in metal alloys, are also known to impact work function in the finished device.

BRIEF DESCRIPTION OF THE DRAWINGS

FIG. 5 is a view of the FIG. 3 substrate at an alternate processing step to that shown by FIG. 4.

FIG. 6 is a diagrammatic sectional view of another substrate in process in accordance with an embodiment of the invention.

FIG. 11 is a view of the FIG. 10 substrate at a processing step subsequent to that shown by FIG. 10.

FIG. 12 is a view of the FIG. 11 substrate at a processing step subsequent to that shown by FIG. 11.

FIG. 17 is a view of the FIG. 16 substrate at a processing step subsequent to that shown by FIG. 16.

FIG. 18 is a view of the FIG. 17 substrate at a processing step subsequent to that shown by FIG. 17.

DETAILED DESCRIPTION OF EXAMPLE EMBODIMENTS

Figure 1:
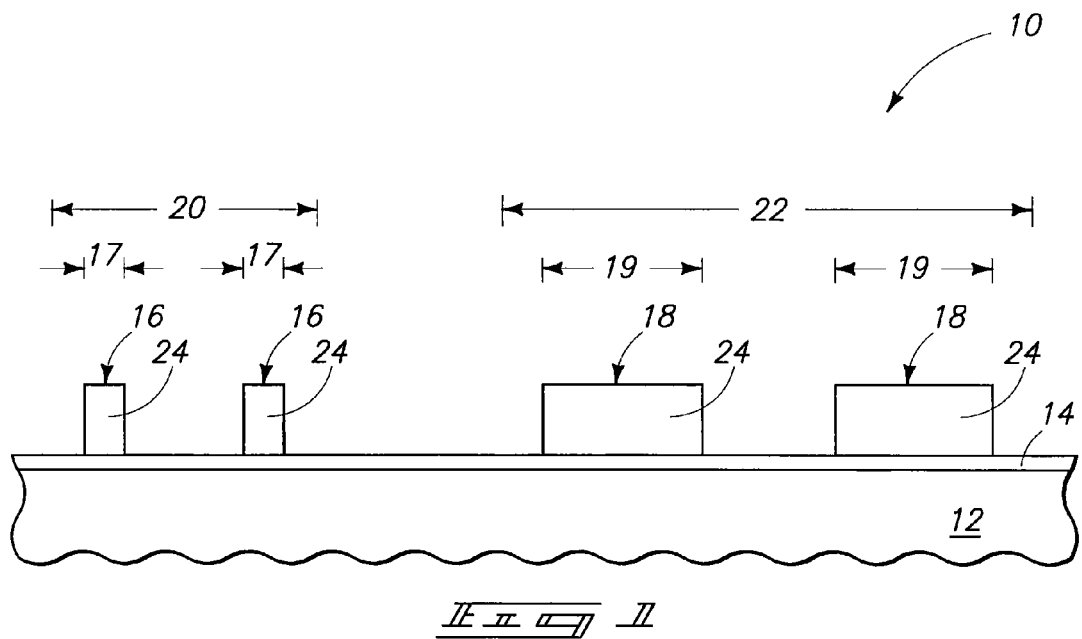
FIG. 1 is a diagrammatic sectional view of a substrate in process in accordance with an embodiment of the invention.

A first example method of forming a plurality of transistor gates having at least two different work functions is described with reference to FIGS. 1-4. Referring to FIG. 1, a substrate, which may be a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 includes a semiconductive region 12 within which source/drain and channel regions (not shown) have or will be fabricated. An example material 12 is monocrystalline silicon suitably doped with one or more conductivity-enhancing impurities to one or more concentrations. Substrate 10 may include other layers or regions, for example trench isolation (not shown) which are not particularly material to the disclosure.

A gate dielectric 14 has been formed over substrate 12. An example thickness for gate dielectric 14 is from about 3 nanometers to about 10 nanometers, with about 5 nanometers being a specific example. A first transistor gate 16 and a second transistor gate 18 have been formed over substrate 12/14. First gate 16 has a first width 17 and second gate 18 has a second width 19, with first width 17 being narrower than second width 19. In the depicted embodiment, a plurality of first gates 16 and a plurality of second gates 18 have been formed over substrate 12/14, with first gates 16 having been formed within a first area 20 and second gates 18 having been formed within a different second area 22. Not all of the gates fabricated within first area 20 are necessarily of the same material, size, or shape, and not all of the transistor gates fabricated within second area 22 are necessarily of the same material, size, of shape. An example first width 17 is from about 20 nanometers to about 75 nanometers, with about 50 nanometers being a specific example. An example width 19 is from about 40 nanometers to about 200 nanometers, with about 150 nanometers being a specific example.

In the context of this document, a "gate" or "transistor gate" alone refers to the conductive portion of a field-effect transistor gate construction, and a gate construction may include additional material, such as insulative sidewall spacers, an insulative cap, and/or a gate dielectric. The example gates 16, 18 are shown as not having insulative spacers or caps formed thereover or thereabout, and comprise a conductive region 24. However, insulative caps and/or spacers may be provided. Further, flash and other gate constructions might be used. Accordingly, conductive region 24 may comprise a control gate region or a floating gate region of a transistor. Conductive region 24 may be homogenous or non-homogenous. Example materials include conductively doped polysilicon, conductive metal compounds, and one or more elemental-form metals, including an alloy of multiple elemental-form metals. Example metals include platinum, cobalt, iridium, titanium, tungsten, tantalum, aluminum, iron, zirconium, vanadium, and hafnium.

Transistor gates 16 and 18 may be formed by any existing or yet-to-be developed manner. One technique includes photolithographic patterning and etch, with FIG. 1 depicting an etch of material 24 as having been conducted selectively relative to gate dielectric 14 such that it remains spanning between adjacent of the conductive gates over semiconductive material 12. Alternately, the processing might be conducted to not be selective, or etching continued to remove some or all of gate dielectric 14 from being received over substrate material 12 between the gates. Further, FIG. 1 depicts an example wherein the transistor gates are fabricated to be of equal thickness, although multiple thicknesses and/or configurations may also be used. An example thickness for conductive region 24 is from about 10 nanometers to about 100 nanometers, with about 75 nanometers being a specific example. Additionally, FIG. 1 depicts the transistor orientation being planar or horizontal. Alternate configurations, such as vertical transistors and/or transistors formed in trenches, are also contemplated, and whether existing or yet-to-be developed.

Figure 2:
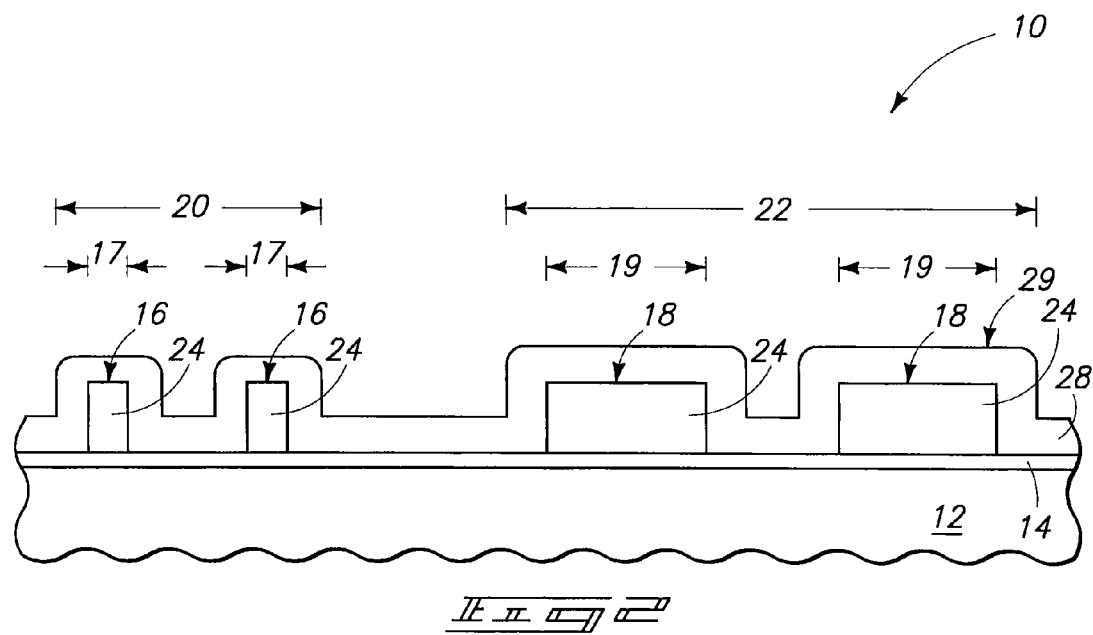
FIG. 2 is a view of the FIG. 1 substrate at a processing step subsequent to that shown by FIG. 1.

Referring to FIG. 2, a material 28 has been deposited over substrate 10, including over first and second gates 16, 18, respectively. Material 28 may be insulative, conductive (including conductively doped semiconductive materials), or semiconductive, including any combination of such. Examples include silicon dioxide, silicon nitride, polysilicon, carbon, titanium nitride, tantalum nitride and tungsten nitride. Material 28 may be deposited to a thickness which is less than, equal to, or greater than each of first and second gates 16, 18. Regardless, material 28 may be deposited substantially conformably or non-conformably over each of the first and second gates, and may be deposited to have a planar or non-planar outermost surface. FIG. 2 depicts an example wherein material 28 has been deposited in a substantially conformal manner to have a non-planar outermost surface 29, and to a thickness which is less than that of each of first and second gates 16, 18. In some embodiments, material 28 is of different composition from that of an outermost portion of conductive region 24 of transistor gates 16, 18.

Figure 3:
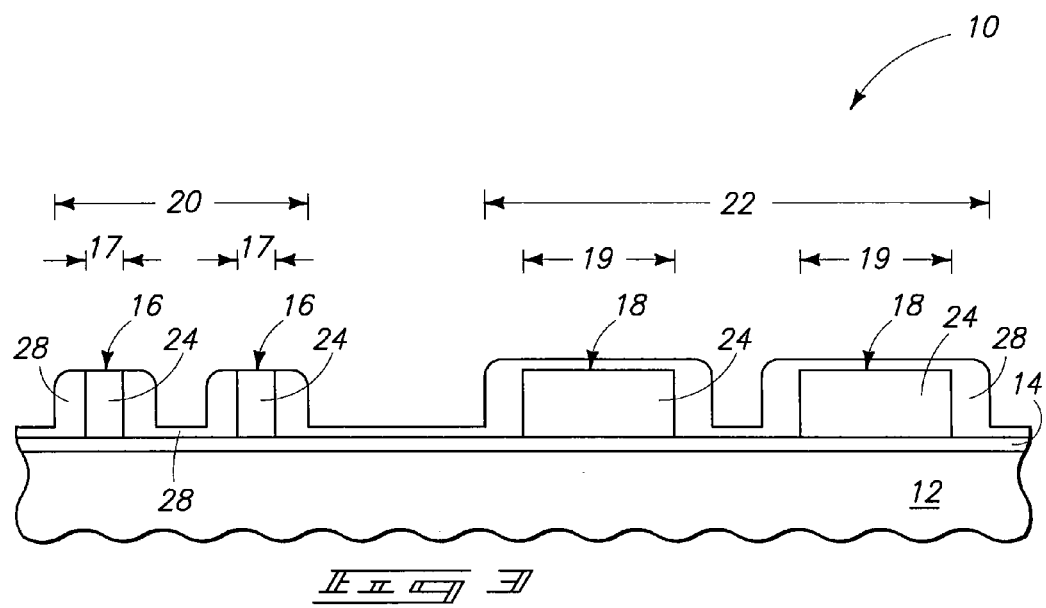
FIG. 3 is a view of the FIG. 2 substrate at a processing step subsequent to that shown by FIG. 2.

Referring to FIG. 3, substrate 10 has been placed within an etch chamber, and material 28 has been etched from over both of first gates 16 and second gates 18. The etching of material 28 has been effective to expose conductive material of first gates 16 and to reduce thickness of material 28 received over second gates 18 yet to leave second gates 18 still covered by material 28. By way of example only, example suitable etching chambers include high temperature plasma etchers which are capable of achieving substrate temperatures of at least 300° C., for example the etching chamber of the DPSII G3 HT plasma etching reactor sold by Applied Materials, Inc. of Santa Clara, Calif. and the etching chamber of the 2300 Kiyo plasma etching reactor sold by Lam Research Corporation of Fremont, Calif. Such ideally enable plasma etching which provide substrate temperature above 300° C., although other reactors might be used.

Such reactors may be operated in one embodiment to produce the example FIG. 3 depicted result wherein the etching action has completely cleared material 28 from being received over narrower width transistor gates 16 as compared to wider width transistor gates 18, with the etching action of FIG. 3 having been stopped at or shortly after exposure of narrower width transistor gates 16. Suitable conditions and etching chemistries will be selected by the artisan depending upon the transistor gate width and the composition and configuration of material 28 received over transistor gates 16, 18. The etching is ideally conducted as a plasma etch with fairly high bias and a partially physically driven etch so that facets effectively form proximate narrow width gates 16 to help expose such features more quickly than larger width gates 18. For example, where material 28 consists essentially of carbon, example conditions include substrate temperature from about 250° C. to about 400° C., chamber pressure from about 20 mTorr to about 100 mTorr, inductive power from about 100 W to about 500 W, and bias power from about 200 W to about 600 W. Example etch gases include from 0 sccm to about 500 sccm of one or a combination of Ar, He, Ne, Kr, and Xe, plus from about 50 sccm to about 200 sccm of $N_2$, and from about 250 sccm to about 100 sccm of $O_2$, with volumetric ratio of $N_2$ to $O_2$ ideally being at least 2:1. Alternate or overlapping conditions and chemistries can be determined by the artisan for materials other than carbon for material 28. The etching action may or may not clear material 28 from spanning between adjacent of the transistor gates, with FIG. 3 depicting an example wherein some thickness of material 28 remains spanning between adjacent transistor gates.

Figure 4:
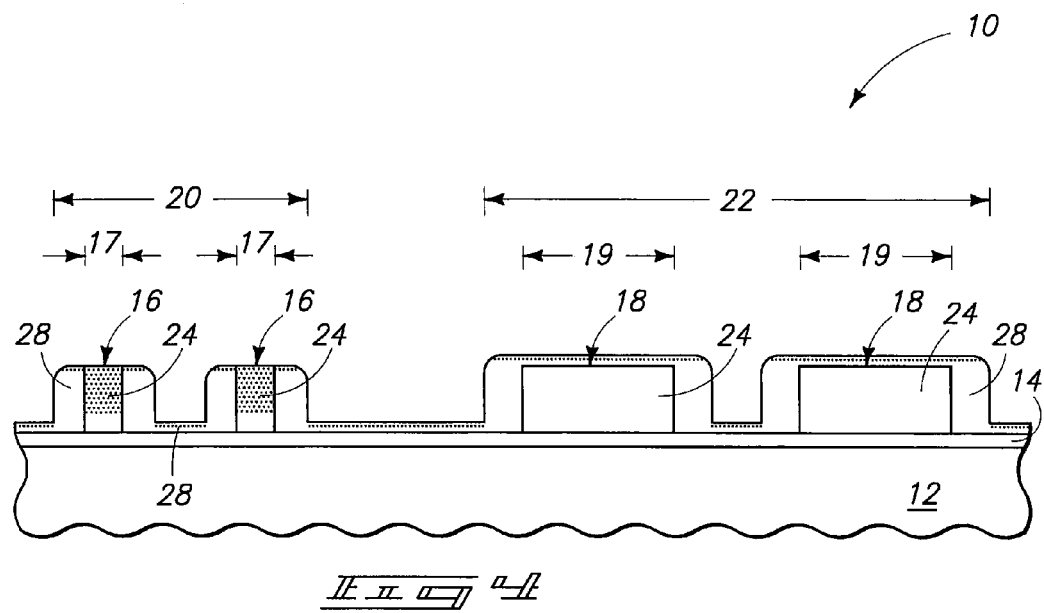
FIG. 4 is a view of the FIG. 3 substrate at a processing step subsequent to that shown by FIG. 3.

Referring to FIG. 4, and in situ within the etch chamber and after the etching of FIG. 3, substrate 10 has been subjected to a plasma comprising a metal at a substrate temperature of at least 300° C. to diffuse said metal into first gates 16 to modify work function of first gates 16 as compared to work function of second gates 18. In the context of this document, in situ action requires the subjecting to be conducted in the very same chamber within which the etching occurred and without removing the substrate from the etch chamber between the etching and the subjecting to the plasma comprising the metal. The metal from the plasma may or may not be in a plasma state at the moment of starting the diffusion, and accordingly may alternately be in a gaseous state. FIG. 4 depicts the metal diffusion into conductive regions 24 by stippling in the drawing, with the dots indicating the diffused metal. Such diffusion may or may not distribute the metal homogenously throughout conductive region 24, and regardless of whether conductive region 24 was homogenous before the exposure to the plasma containing the metal. FIG. 4 depicts an example wherein metal diffusion within conductive region 24 of first gates 26 is not homogenous throughout region 24. In such event, ideally diffusion of the metal from the plasma to within conductive region 24 is to within at least about 10 nanometers of the depicted upper surface of gate dielectric 14 to have a significant impact on work function of the gate. Further, the plasma to which the substrate is exposed may include one or more different metals such that one or more different metals might be diffused into conductive region 24 of first gates 16. Quantity of the metal diffused can be selected and determined by the artisan depending upon the impact desired on the work function of the gate. Further, such may be impacted based upon factors such as plasma composition, plasma conditions, time of exposure to the plasma, and composition of the conductive region into which the metal is diffusing.

Exposure to the plasma may or may not also diffuse the metal from the plasma into material 28 received over second gates 18, and regardless material 28 received over second gates 18 may or may not shield any of the metal from diffusing into second gates 18 during the exposure to plasma. FIG. 4 depicts an example wherein some diffusion of metal has also occurred into material 28, but not having been effective to diffuse any metal to within any of second gates 18. FIG. 5 depicts an alternate embodiment substrate 10a, like numerals from the first-described embodiment have been utilized where appropriate, with differences being indicated with the suffix "a". In the plasma exposure of FIG. 5, the diffusion of the metal has been effective to diffuse into and through material 28 into an outermost portion of conductive region 24 of second gates 18. Regardless, any such diffusion of metal to within second gates 18 is considerably less than that into first gate 16 such that work function of the first gates is modified as compared to any work function modification which may or may not occur to second gates 18.

Diffusion of example metals that will inherently increase work function include platinum, cobalt and iridium where, for example, conductive region 24 of first gate 16 includes elemental-form metals or an alloy of elemental-form metals. Further, if conductive region 24 prior to the metal diffusion includes an alloy including one or a combination of platinum, cobalt and iridium, diffusion of more platinum, cobalt and iridium into such conductive regions will tend to increase work function. Correspondingly, examples of metals which reduce work function in metal conductive regions include titanium, tungsten, tantalum, aluminum and iron. Further, for example if the outermost portion of conductive region 24 comprises conductively doped polysilicon, diffusing of the metal may form the outermost portion of conductive region 24 to comprise a conductive metal silicide. In one ideal embodiment, the metal in the plasma is derived from an organometallic compound. Examples include tetracarbonyl nickel for nickel, ferrocene for iron, $Ti(N(CH_3)_2)_4$ and/or $Ti(N(C_2H_5)_2)_4$ for titanium, pentrkis-dimethyl amido-tantalum for tantalum, $Co_2(CO)_8$ for cobalt, and $Pt(C_2H_5C_5H_4)(CH_3)_3$ for platinum. Compounds other than organometallic might alternately be used, for example metal halides such as $TiCl_4$ and others. Example conditions in an inductively coupled high temperature etching reactor include substrate temperature from 300° C. to about 400° C., chamber pressure from about 5 mTorr to about 200 mTorr, inductive/source power from about 100 W to about 1,000 W, and bias power from 0 W to about 100 W. Example flow rates for the metal-containing gas are from about 10 sccm to about 200 sccm, and from 0 sccm to about 1,000 sccm of a suitable inert carrier gas to perhaps improve plasma uniformity and density (i.e., Ar, He, Xe, Kr, Ne and/or $N_2$). Substrate temperature may be controlled by temperature of the susceptor or other support upon which the substrate rests. For example, the above described reactors may have their susceptors set to temperatures of 300° C. or higher, with the substrate temperature during the exposure to plasma being from about 10° C. to 50° C. higher depending on conditions of the plasma.

The etching of FIG. 3 and the exposure to plasma of FIG. 4 or 5 may occur with or without any mask being received over any of material 28, with no mask being shown/received over any of material 28 in the depicted cross-section of FIGS. 3-5.

Another example embodiment method of forming a plurality of transistor gates having at least two different work functions is described with reference to FIGS. 6-10 with respect to a substrate 10b. Like numerals from the first-described embodiments have been utilized where appropriate, with differences being indicated with the suffix "b" or with different numerals. Referring to FIG. 6, a plurality of transistor gates 32 comprising a conductive region 33 have been formed over a substrate 12/14. The transistor gates may or may not have at least two different widths, with gates 32 shown as having equal widths in FIG. 6. The transistor gates of FIG. 6 could have the example configurations of one or the other of gates 16, 18 in FIG. 1, or other configurations. Composition of conductive region 33, by way of example only, may be the same as that described above in connection with transistors 16, 18 of the first-described embodiment. Sidewall spacers and/or caps might be provided relative to transistor gates 32.

A material 34 has been provided over conductive region 33 of transistor gates 32, with such material being of different composition from that of an outermost portion of conductive region 33. Otherwise, example materials and attributes include any of those described above with respect to material 28 in the first-described embodiment.

Figure 7:
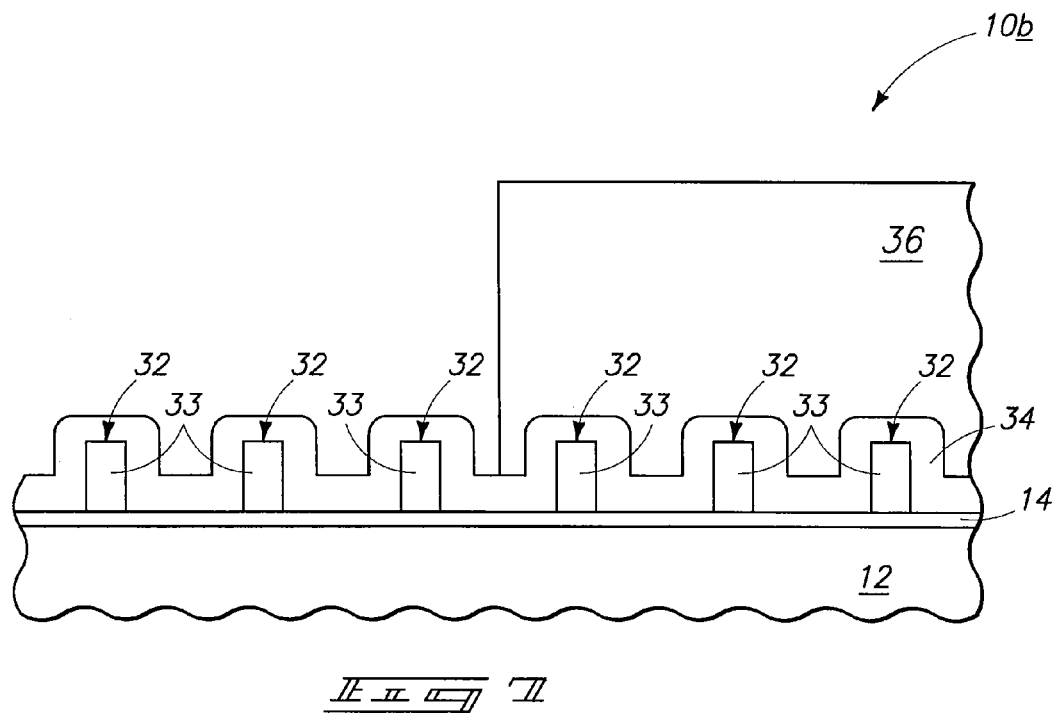
FIG. 7 is a view of the FIG. 6 substrate at a processing step subsequent to that shown by FIG. 6.

Referring to FIG. 7, a mask 36 has been formed to cover some of transistor gates 32 and leave others of transistor gates 32 not covered by mask 36. Any suitable existing or yet-to-be developed mask might be utilized, and for example with such being either wholly or partly sacrificial. An example material includes photoresist with or without one or more anti-reflective coating layers.

Figure 8:
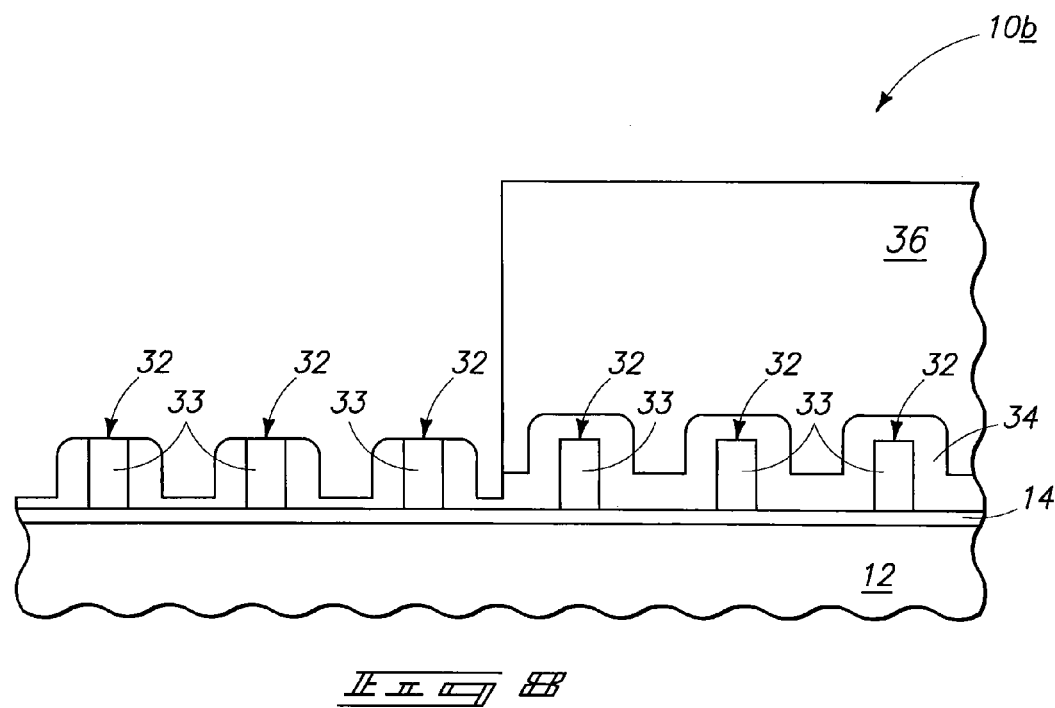
FIG. 8 is a view of the FIG. 7 substrate at a processing step subsequent to that shown by FIG. 7.

Referring to FIG. 8, within a suitable etching chamber and after forming mask 36, material 34 has been etched from being received over those transistor gates 32 which are not covered by mask 36. Example chambers, chemistries and conditions include any of those described above in connection with the processing to produce the FIG. 3 substrate. Material 34 may or may not be etched to less than completely span between adjacent of the exposed transistor gates 32 which are not covered by mask 36. FIG. 8 shows some material 34 spanning between adjacent of the exposed gates 32 after the etch. Alternately, all of material 34 not covered by mask 36 could be removed.

Figure 9:
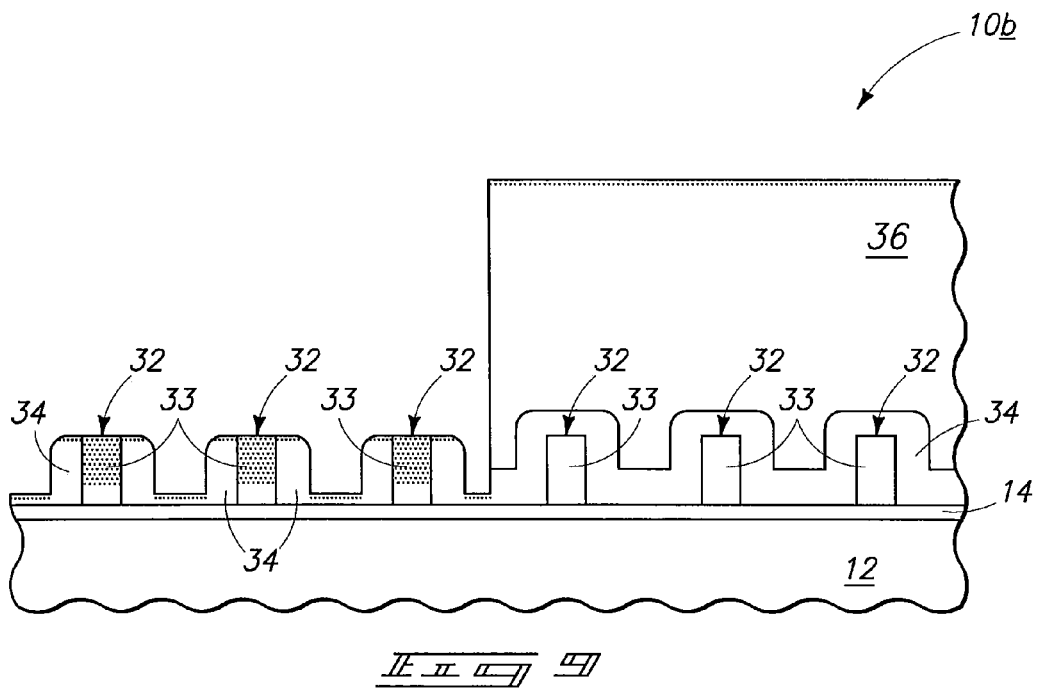
FIG. 9 is a view of the FIG. 8 substrate at a processing step subsequent to that shown by FIG. 8.

Referring to FIG. 9 and in situ within the etch chamber after the etching of FIG. 8, substrate 10b has been subjected to a plasma comprising a metal at a substrate temperature of at least 300° C. The exposure to plasma has been effective to diffuse the metal from the plasma into the conductive region of the transistor gates 32 which are not covered by mask 36 to modify work function of the uncovered transistor gates 32 as compared to work function of transistor gates 32 which are covered by mask 36. Ideally, mask 36 shields any of the metal from the plasma from diffusing into conductive region 33 of the covered/masked transistor gates 32. Example processing condition and chemistries are as described above in connection with the FIGS. 4 and 5 embodiments. Accordingly, conductive region 33 may or may not be homogenous before and after the exposure to plasma, and the metal may diffuse uniformly or only partially into conductive region 33 to still have an impact upon and modify work function of transistor gates 32 which are not covered by mask 36.

Figure 10:
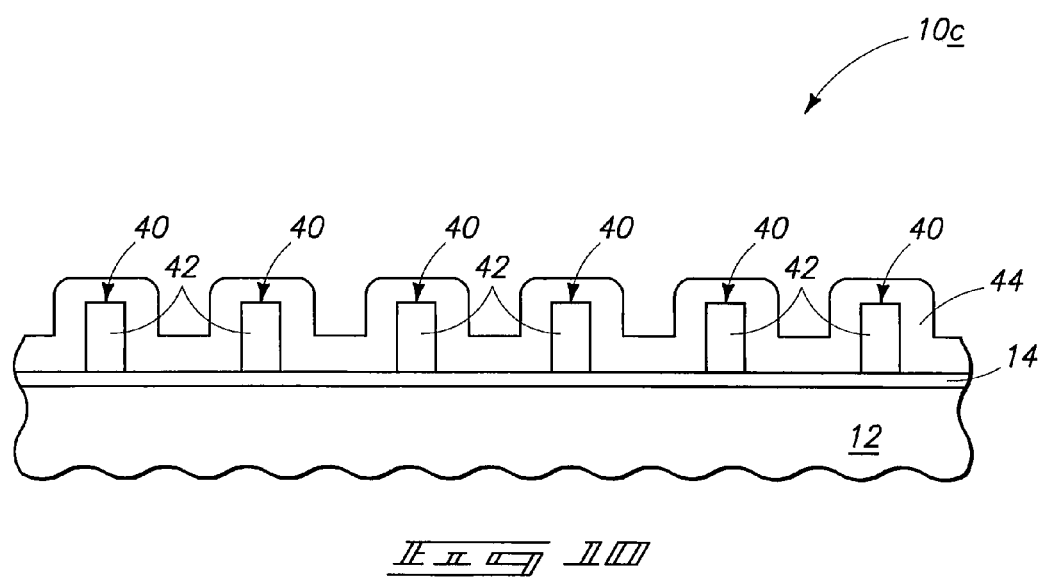
FIG. 10 is a diagrammatic sectional view of another substrate in process in accordance with an embodiment of the invention.

Embodiments of methods of forming a plurality of transistor gates may or may not result in at least two different work functions for different gates. The example embodiments as described above resulted in at least two different work functions for different gates. One example of an embodiment not necessarily resulting in at least two different work functions is shown with respect to a substrate 10c in FIGS. 10-15. Like numerals from the first-described embodiment have been utilized where appropriate, with differences being indicated with the suffix "c" or with different numerals. Referring to FIG. 10, a plurality of transistor gates 40 having conductive regions 42 has been formed over substrate 12/14. Example materials and constructions include any of those described above with respect to the FIGS. 1-9 embodiments. A first material 44 has been deposited over substrate 12/14 including over and spanning between adjacent of transistor gates 40. First material 44 is of different composition from that of an outermost portion of conductive region 42 of transistor gates 40. Example materials and attributes include any of those described above with respect to materials 28/34. Accordingly by way of example, first material 44 may or may not have a planar outermost surface, with a non-planar outermost surface being shown in FIG. 10.

Referring to FIG. 11, first material 44 has been etched to remove it from spanning between adjacent of transistor gates 40 yet leave first material 44 covering tops and sidewalls of transistor gates 40.

Referring to FIG. 12, a second material 46 has been deposited over the substrate including over and spanning between adjacent of transistor gates 40. Second material 46 may be the same or different in composition from that of an outermost portion of first material 44. Further, second material 46 may have a planar or non-planar outermost surface, with a planar outermost surface being shown in FIG. 12. Examples include any of those described above for material 28. Second material 46 may be deposited to a thickness which is less than, equal to, or greater than thickness of transistor gates 40.

Figure 13:
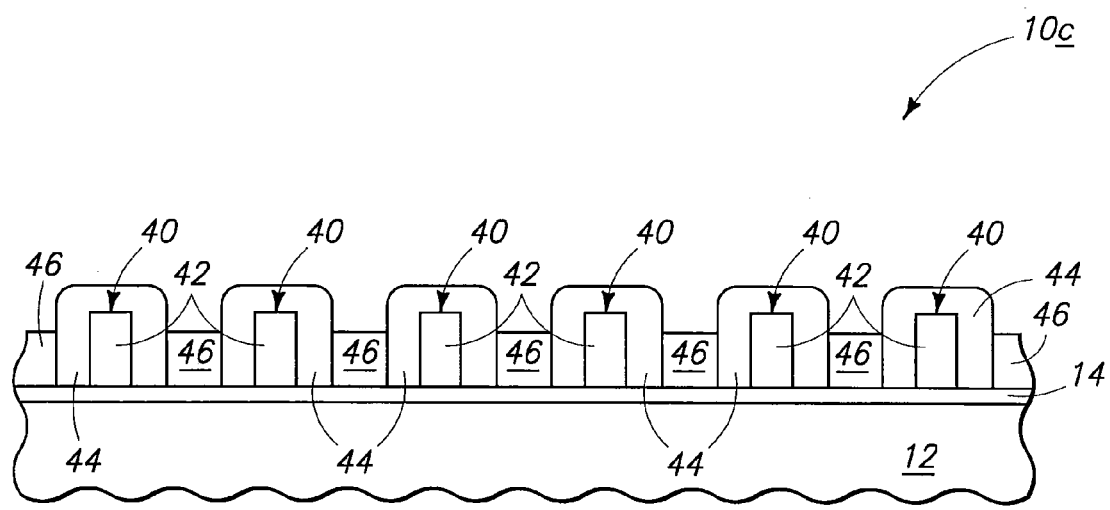
FIG. 13 is a view of the FIG. 12 substrate at a processing step subsequent to that shown by FIG. 12.

Referring to FIG. 13, second material 46 has been etched from being received over at least some of transistor gates 40 but remain spanning between adjacent of transistor gates 40. FIG. 13 depicts an embodiment wherein second material 44 has been etched from being received over all of transistor gates 40. Such might be conducted with or without masking.

Figure 14:
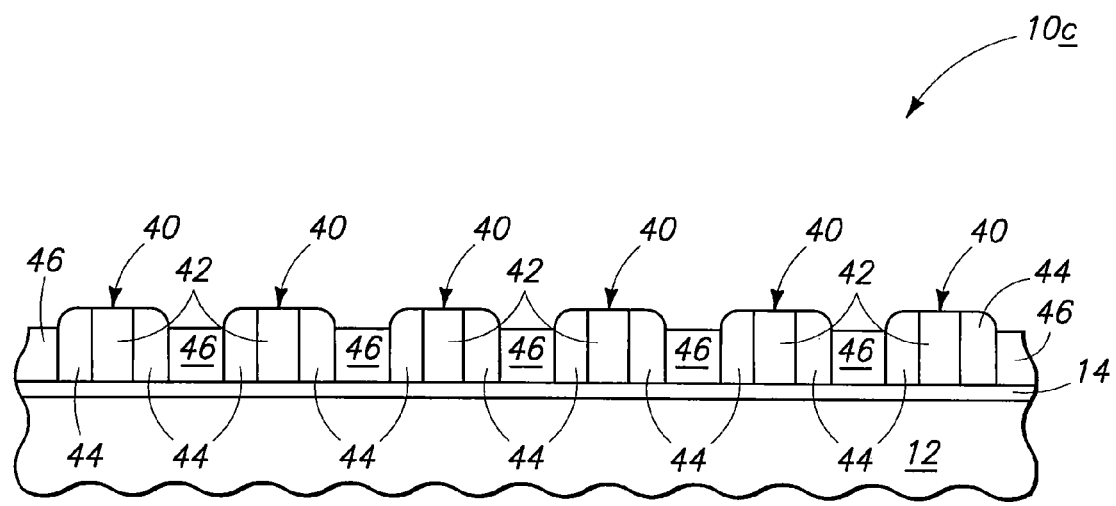
FIG. 14 is a view of the FIG. 13 substrate at a processing step subsequent to that shown by FIG. 13.

Referring to FIG. 14, within an etch chamber and after etching second material 46, first material 44 has been etched from being received over at least some of transistor gates 40, with FIG. 14 depicting an example wherein first material 44 has been etched from being received over all of transistor gates 40. Such etching may or may not be conducted selectively relative to second material 46 where such is of different composition from first material 44, with a selective etching having been conducted as shown in FIG. 14. Regardless, in one embodiment, etching of second material 46 as shown in FIG. 13 may be conducted within the same etch chamber as the etching depicted by FIG. 14. Further, in one embodiment, the etching of first material 44 from being received over at least some of transistor gates 40 as shown in FIG. 14 may occur in situ after the second material etch of FIG. 13. Example etching of first material 44 in FIG. 14 may be conducted, for example, as described above in connection with any of the FIGS. 3 and 8 embodiments.

Figure 15:
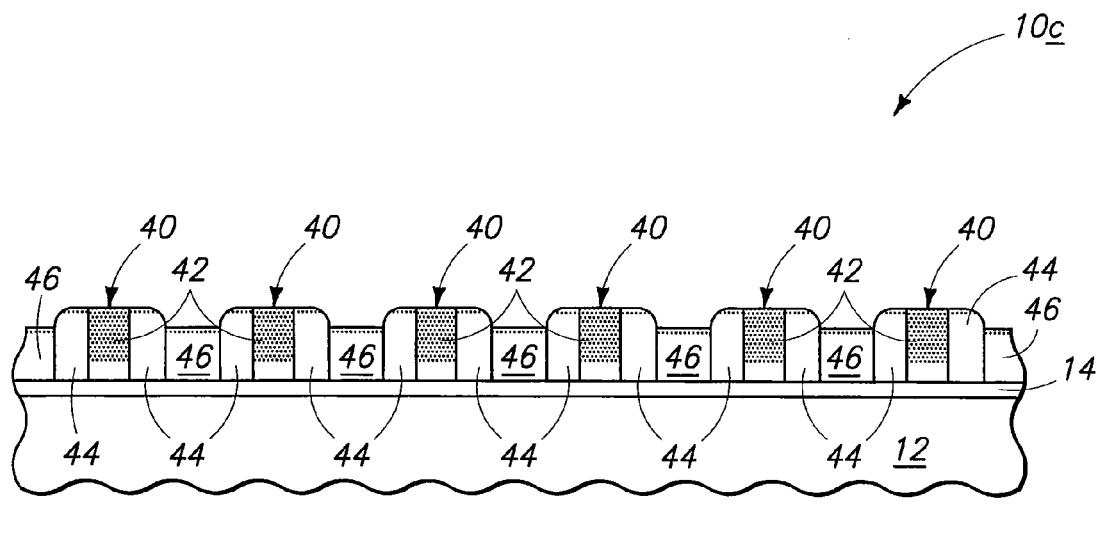
FIG. 15 is a view of the FIG. 14 substrate at a processing step subsequent to that shown by FIG. 14.
Figure 16:
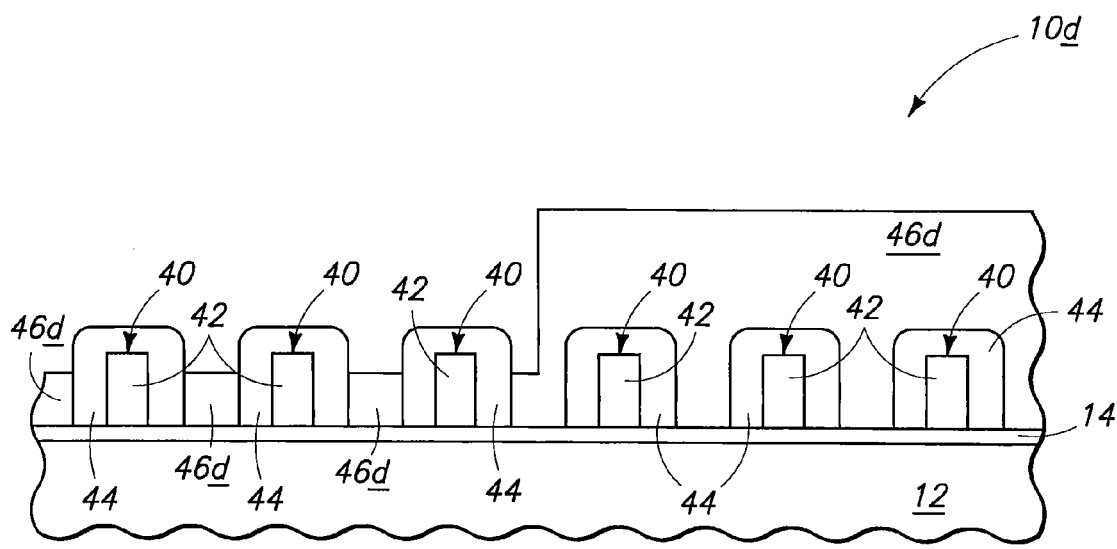
FIG. 16 is a diagrammatic sectional view of another substrate in process in accordance with an embodiment of the invention.

Referring to FIG. 15, substrate 10c has been subjected to a plasma comprising a metal at a substrate temperature of at least 300° C. to diffuse the metal from the plasma into conductive region 42 of transistor gates 40 to modify work function of transistor gates 40. Such subjecting/exposing has been conducted in situ within the etch chamber after the etching of first material 44 from being received over at least some of transistor gates 40 as was depicted in FIG. 14. Example processing may be as described above with respect to any of the FIGS. 4, 5 and 9 embodiments. Where all transistor gates are exposed during the exposure to plasma as depicted by FIGS. 14 and 15, work function of all transistor gates 40 will be modified. FIGS. 16-18 depict an example alternate embodiment wherein at least two different work functions result, in part as a result of some of the second material remaining over some of the transistor gates during the exposure to plasma.

Specifically, FIGS. 16-18 depict processing relative to an alternate embodiment substrate 10d. Like numerals from the above-described embodiments have been utilized where appropriate, with differences being indicated with the suffix "d" or with different numerals. FIG. 16 depicts processing of substrate 10d with respect to second material 46d subsequent to the FIG. 12 embodiment. In FIG. 16, second material 46d has been masked (no mask being shown) while some of second material 46d has been left outwardly exposed and etched from being received elevationally over only some of transistor gates 40 (specifically, the left three illustrated gates in FIG. 16).

FIG. 17 depicts subsequent processing whereby first material 44 has been etched from being received over the exposed, and thereby over only some of, transistor gates 40. FIG. 18 depicts subsequent processing wherein in situ within the etch chamber within which the FIG. 17 etching occurred, substrate 10d has been exposed to the above-described metal-containing plasma to diffuse the metal into conductive region 42 of the three left illustrated transistor gates 40.

In one embodiment, a method encompasses forming a plurality of transistor gates comprising a conductive region over a substrate. The transistor gates may or may not have at least two different widths. Any of the above-described and shown plurality of transistor gates of FIG. 1, 6 or 16 are examples of such transistor gates. A material is provided over the conductive region of the transistor gates, with such material being of different composition from that of an outermost portion of the conductive region of the transistor gates. Any one or a combination of material 28, 34, 44 and 46 are examples of such material. Further, for example, first material 44 and second material 46 in combination, regardless of whether first material 44 is removed to not span completely between transistor gates 40, is also such an example material. Accordingly, "material" as used here and elsewhere in this document does not require homogeneity and may include multiple different composition and/or density regions and/or layers.

Within an etch chamber, the material is blanketly etched from being received over the conductive region of the transistor gates. Example chambers, chemistries, and conditions are as described above with the etching of any of materials 28, 34, and 44. By way of example only, the processing in going from FIG. 13 to FIG. 14 may be considered as depicting such an embodiment whereby material 44 is shown as being as blanketly etched from being received over conductive region 42 of gates 40. Alternately by way of example only, the substrates of FIGS. 2 and 6 might be blanketly etched to remove material 28 and 34, respectively, from being received over the conductive region of all of the depicted transistor gates Then, in situ within the etch chamber after the blanket etching, the substrate is subjected to a plasma comprising a metal at a substrate temperature of at least 300° C. to diffuse the metal from the plasma into the conductive region of the transistor gates to modify work function of the transistor gates. Example techniques, conditions, and chemistries for doing the same may be as those described above with respect to the processing of any of FIGS. 4, 5, 9, 15 and 18.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a plurality of transistor gates having at least two different work functions, comprising:
    forming first and second transistor gates over a substrate, the first gate having a first width and the second gate having a second width, the first width being narrower than the second width;
    depositing a material over the substrate including over the first and second gates;
    within an etch chamber, etching the material to expose conductive material of the first gate and to leave the material over the second gate; and
    in situ within the etch chamber after the etching, subjecting the substrate to a gaseous metal at a substrate temperature of at least 300° C. to diffuse said metal into the first gate to modify work function of the first gate as compared to work function of the second gate.

2. The method of claim 1 wherein the material received over the second gate shields any of said metal from diffusing into the second gate during the subjecting.

3. The method of claim 1 wherein the subjecting also diffuses said metal into the material received over the second gate.

4. The method of claim 3 wherein the material received over the second gate shields any of said metal from diffusing into the second gate during the subjecting.

5. The method of claim 3 wherein some of said metal also diffuses into the second gate.

6. The method of claim 5 wherein the metal diffuses deeper into the first gate than into the second gate.

7. The method of claim 1 wherein the metal is derived from an organometallic compound.

8. The method of claim 1 wherein the etching and subjecting occur without any mask being received over any of the material.

9. The method of claim 1 wherein the metal is derived from a metal halide.

10. A method of forming a plurality of transistor gates having at least two different work functions, comprising:
    forming a plurality of transistor gates over a substrate, the transistor gates comprising a conductive region;
    providing a material over the conductive region of the transistor gates, the material being of different composition from that of an outermost portion of the conductive region of the transistor gates;
    after providing the material, forming a mask to cover some of the transistor gates and leave others of the transistor gates not covered by the mask;
    within an etch chamber and after forming the mask, etching the material from being received over the transistor gates which are not covered by the mask; and
    in situ within the etch chamber after the etching, subjecting the substrate to a gaseous metal at a substrate temperature of at least 300° C. to diffuse said metal into the conductive region of the transistor gates which are not covered by the mask to modify work function of the transistor gates which are not covered by the mask as compared to work function of the transistor gates which are covered by the mask.

11. The method of claim 10 wherein the material is insulative.

12. The method of claim 10 wherein the material is conductive or semiconductive.

13. The method of claim 10 wherein the mask shields any of said metal from diffusing into the conductive region of the transistor gates which are covered by the mask.

14. The method of claim 10 wherein at least the outermost portion of the conductive region comprises at least one of elemental form metal or an alloy of elemental form metals.

15. The method of claim 14 wherein all of the conductive region consists essentially of one or more elemental form metals or an alloy of elemental form metals.

16. The method of claim 10 wherein at least the outermost portion of the conductive region comprises conductively doped polysilicon, the subjecting forming a conductive metal silicide within the conductive region.

17. The method of claim 10 wherein the metal is derived from an organometallic compound.

18. The method of claim 10 wherein the metal is derived from a metal halide.

19. A method of forming a plurality of transistor gates, comprising:
    forming a plurality of transistor gates over a substrate, the transistor gates comprising a conductive region;
    depositing a first material over the substrate including over and spanning between adjacent of the transistor gates, the first material being of different composition from that of an outermost portion of the conductive region of the transistor gates;
    etching the first material to remove it from spanning between adjacent of the transistor gates yet leave the first material over tops and sidewalls of the transistor gates;
    after etching the first material, depositing a second material over the substrate including over and spanning between adjacent of the transistor gates;
    etching the second material from being received over at least some of the transistor gates but remain spanning between adjacent of the transistor gates;
    within an etch chamber and after etching the second material, etching the first material from being received over said at least some of the transistor gates; and
    in situ within the etch chamber after the etching of the first material from being received over said at least some of the transistor gates, subjecting the substrate to a gaseous metal at a substrate temperature of at least 300° C. to diffuse said metal into the conductive region of said at least some of the transistor gates to modify work function of said at least some of the transistor gates.

20. The method of claim 19 wherein the second material is deposited to have a planar outermost surface.

21. The method of claim 20 wherein the first material is deposited to have a non-planar outermost surface.

22. The method of claim 19 wherein etching of the second material occurs within the chamber, the etching the first material from being received over said at least some of the transistor gates occurring in situ thereafter.

23. The method of claim 19 comprising etching the second material from being received over only some of the transistor gates.

24. The method of claim 19 comprising etching the second material from being received over all of the transistor gates.

25. The method of claim 19 wherein the metal is derived from an organometallic compound.

26. The method of claim 19 comprising forming the plurality of transistor gates to have at least two different widths.

27. The method of claim 19 wherein the metal is derived from a metal halide.

28. A method of forming a plurality of transistor gates, comprising:
   forming a plurality of transistor gates over a substrate, the transistor gates comprising a conductive region;
   providing a material over the conductive region of the transistor gates, the material being of different composition from that of an outermost portion of the conductive region of the transistor gates;
   within an etch chamber, blanketly etching the material from being received over the conductive region of the transistor gates; and
   in situ within the etch chamber after the etching, subjecting the substrate to a gaseous metal at a substrate temperature of at least 300° C. to diffuse said metal into the conductive region of the transistor gates to modify work function of the transistor gates.

29. The method of claim 28 wherein the conductive region is not homogenous after the subjecting.

30. The method of claim 29 wherein the conductive region is homogenous before the subjecting.

31. The method of claim 28 wherein the conductive region is homogenous before and after the subjecting.

32. The method of claim 28 wherein the metal in the plasma is derived from an organometallic compound.

33. The method of claim 28 wherein the metal is derived from a metal halide.

* * * * *